(12) United States Patent
Kalnitsky et al.

(10) Patent No.: US 9,698,044 B2
(45) Date of Patent: Jul. 4, 2017

(54) LOCALIZED CARRIER LIFETIME REDUCTION

(75) Inventors: Alex Kalnitsky, San Francisco, CA (US); Chih-Wen Yao, Hsinchu (TW); Jun Cai, Scarborough, ME (US); Ruey-Hsin Liu, Hsinchu (TW); Hsiao-Chin Tuan, Judong County (TW)

(73) Assignee: TAIWAN SEMICONDUCTOR MANUFACTURING COMPANY, LTD. (TW)

( * ) Notice: Subject to any disclaimer, the term of this patent is extended or adjusted under 35 U.S.C. 154(b) by 54 days.

(21) Appl. No.: 13/308,957

(22) Filed: Dec. 1, 2011

(65) Prior Publication Data
US 2013/0140667 A1 Jun. 6, 2013

(51) Int. Cl.
| | |
|---|---|
| *H01L 21/76* | (2006.01) |
| *H01L 21/762* | (2006.01) |
| *H01L 27/092* | (2006.01) |
| *H01L 21/265* | (2006.01) |
| *H01L 29/10* | (2006.01) |
| *H01L 21/8234* | (2006.01) |
| *H01L 21/8238* | (2006.01) |

(52) U.S. Cl.
CPC .. *H01L 21/76237* (2013.01); *H01L 21/26506* (2013.01); *H01L 21/823481* (2013.01); *H01L 21/823878* (2013.01); *H01L 27/0921* (2013.01); *H01L 29/1087* (2013.01); *H01L 21/26586* (2013.01); *H01L 21/76216* (2013.01); *H01L 21/82385* (2013.01); *H01L 21/823456* (2013.01)

(58) Field of Classification Search
CPC ......... H01L 21/76213; H01L 21/76216; H01L 21/76218; H01L 21/76237

USPC ......... 257/519, E21.551; 438/207, 218, 221, 438/296, 298
See application file for complete search history.

(56) References Cited

U.S. PATENT DOCUMENTS

| | | | | |
|---|---|---|---|---|
| 5,525,824 | A | * | 6/1996 | Himi et al. .................... 257/370 |
| 5,770,504 | A | * | 6/1998 | Brown et al. ................ 438/296 |
| 7,176,104 | B1 | * | 2/2007 | Chen et al. ................... 438/424 |
| 2005/0066887 | A1 | * | 3/2005 | Saitoh ............... H01L 29/66242 117/88 |
| 2006/0017132 | A1 | * | 1/2006 | Birner et al. ................. 257/510 |
| 2006/0148194 | A1 | * | 7/2006 | Lim ................... H01L 27/1463 438/419 |
| 2006/0267134 | A1 | * | 11/2006 | Tilke et al. ................... 257/519 |
| 2007/0158694 | A1 | * | 7/2007 | Kim ............................. 257/213 |

(Continued)

FOREIGN PATENT DOCUMENTS

| | | |
|---|---|---|
| CN | 1992346 | 7/2007 |
| CN | 101312191 | 11/2008 |

OTHER PUBLICATIONS

Ker, Ming-Dou et al. "The Impact of Inner Pickup on ESD Robustness of Multi-Finer NMOS in Nanoscale CMOS Technology." IEEE 44th Annual International Reliability Physics Symposium, 2006, pp. 631-632.*

*Primary Examiner* — Eduardo A Rodela
*Assistant Examiner* — Christopher M Roland
(74) *Attorney, Agent, or Firm* — Hauptman Ham, LLP

(57) ABSTRACT

A semiconductor structure includes a substrate, a first power device and a second power device in the substrate, at least one isolation feature between the first and second power device, and a trapping feature adjoining the at least one isolation feature in the substrate.

20 Claims, 15 Drawing Sheets

(56) References Cited

U.S. PATENT DOCUMENTS

| | | | |
|---|---|---|---|
| 2008/0290420 A1* | 11/2008 | Yu ..................... | H01L 21/82380 257/374 |
| 2009/0166744 A1* | 7/2009 | Kim et al. .................... | 257/365 |
| 2012/0153350 A1* | 6/2012 | Kronholz .......... | H01L 21/26506 257/190 |

* cited by examiner

LOCALIZED CARRIER LIFETIME REDUCTION

TECHNICAL FIELD

The disclosure relates generally to a semiconductor structure and, more particularly, to high voltage devices and methods for forming a high voltage devices.

BACKGROUND

High-voltage devices or power devices are commonly used as switches or rectifiers in power electronic circuits or in integrated circuits. Some common power devices are the power diode, thyristor, power metal-oxide-semiconductor field-effect transistor (MOSFET), bipolar junction transistor (BJT) and insulated gate bipolar transistor (IGBT). A power diode or MOSFET operates on similar principles to its low-power counterpart, but is able to carry a larger amount of current and typically is able to support a larger reverse-bias voltage in the off-state. High-voltage devices are increasingly made smaller and smaller, reducing dimensions of various features. As the dimensions decrease, the high-voltage devices become increasingly susceptible to interference between adjacent power devices by unwanted cross talk between adjacent devices. In many instances, the cross talk is caused by lateral parasitic substrate current.

The interference between adjacent power devices also manifests as parasitic structure formation forming a latchup circuit between the power devices. A latchup circuit is a type of short circuit with a low-impedance path between parasitic structures. The parasitic structure is usually equivalent to a thyristor, a PNPN structure which acts as a PNP and an NPN transistor stacked next to each other. During a latchup, when one of the transistors is conducting, the other one begins conducting too. They both keep each other in saturation for as long as the structure is forward-biased and some current flows through it. A latchup circuit can cause a product to fail.

Electronic design includes a latchup rule that describes a minimum distance between two devices, sometimes between two isolation structures, to reduce or eliminate the likelihood of a latchup between devices. High-voltage devices use a larger latchup rule. If kept constant, this minimum distance prevents significant size reductions of circuits containing high-voltage devices. Thus, smaller latchup resistant or latchup proof semiconductor structure designs and methods for making the same continue to be sought.

BRIEF DESCRIPTION OF THE DRAWINGS

Aspects of the present disclosure are best understood from the following detailed description and the accompanying figures. It is emphasized that, in accordance with the standard practice in the industry, various features are not drawn to scale. In fact, the dimensions of the various features may be arbitrarily increased or reduced for clarity of discussion.

DETAILED DESCRIPTION

The making and using of illustrative embodiments are discussed in detail below. It should be appreciated, however, that the disclosure provides many applicable inventive concepts that can be embodied in a wide variety of specific contexts. The specific embodiments discussed are merely illustrative and do not limit the scope of the disclosure.

Figure 1:
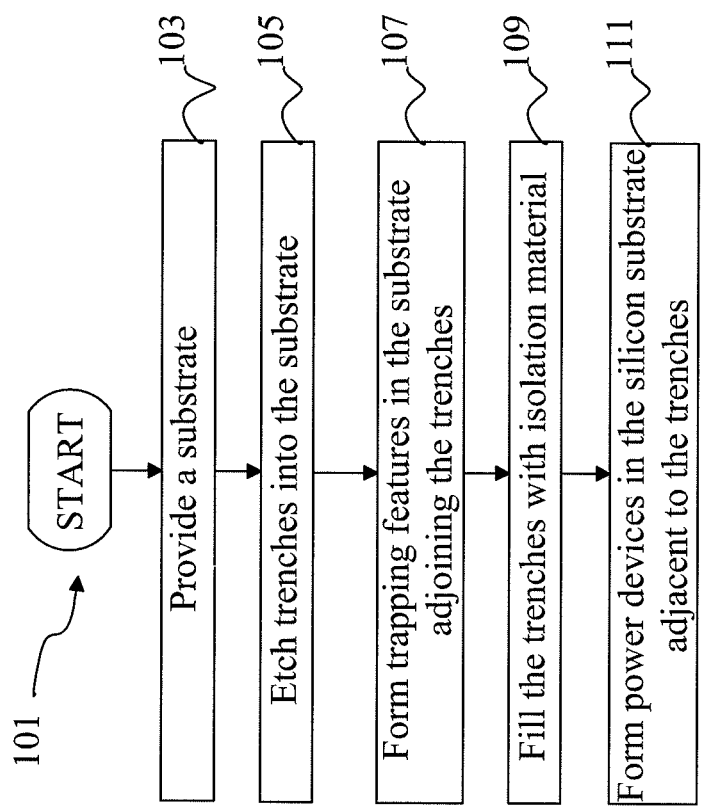
FIG. 1 is a flowchart of a method of forming a semiconductor structure having a latchup resistant structure according to one or more embodiments of this disclosure.

FIG. 1 is a flowchart of a method 101 of forming a semiconductor structure having a latchup resistant structure according to one or more embodiments of this disclosure. In operation 103, a substrate is provided. The substrate is usually a silicon substrate, but may be other semiconductor substrates such as silicon carbide (SiC), silicon dioxide, aluminum oxide, sapphire, germanium, gallium arsenide (GaAs), or indium phosphide (InP). These serve as the foundation upon which power devices such as transistors and diodes are deposited.

In operation 105, trenches are etched into the substrate. The trenches may be shallow or deep and are used to form isolation features in subsequent operations. The trenches divide the substrate into different regions for power devices, which are formed next to the trenches. In some embodiments, one trench is used between power devices. In other embodiments, two or more trenches are used between power devices. Depending on the shape of trenches, various techniques may be used to etch the trenches. A pattern is formed on the substrate surface to protect portions on which the power devices will be formed. The pattern may be formed as a dielectric layer that is subsequently etched to form the pattern. The pattern may also be formed by a photoresist. For shallow trenches, a photoresist pattern covers portions of the substrate, usually in a grid/mesh pattern. The substrate is then subjected to dry etching or wet etching. Plasma assisted dry etch is used for deep trenches. Shallow trenches may be etched using dry etch or wet etch methods. Different etch methods and process parameters allow different trench shapes to form. For example, a process parameter may allow under etch to occur, where edge portions of the protected substrate may be etched in addition to unprotected substrate. Plasma etch techniques are used with biasing of the substrate to direct the etchants at a normal angle into the substrate such that a substantially vertical trench without much under etch is formed. Because of process limitations, a deep trench is usually formed with a small incline angle such that the bottom of the trench is smaller than the opening. For shallow trenches, the trench shape can be made substantially rectangular. The size and shape of trench depends on the amount of isolation desired between the power devices. When two trenches are formed between power devices, a latchup rule determines the minimum distance between nearest edges of the two trenches. In other words, a smaller latchup rule allows the power devices to be placed closer together and more devices may be packed in a die.

In operation 107, trapping features are formed in the substrate adjoining the trenches. The trapping features reduce carrier lifetimes during device operation. Holes and electrons that form parasitic substrate current are recombined or absorbed at the trapping features. The addition of trapping features improves the effectiveness of the isolation features and reduces interference and likelihood of forming a latchup circuit between the power devices. As result, the latchup rule may be made smaller without increasing the likelihood of a latchup.

The trapping features are formed around the bottom of the trenches, in the substrate lining the trenches both on the sidewalls and at the bottom, or a portion of the substrate on the sidewalls. A portion of the substrate is processed to include additional material to form trapping features. The additional materials include germanium, carbon, or an inert gas species. In various embodiments, incorporating the additional material introduce lattice defects and strains in the substrate that provides additional carrier recombination sites.

In one aspect, the trapping features are formed by implanting the bottom of the trenches with one or more dopants. Germanium, carbon, and inert gas species, such as nitrogen, neon, argon, krypton, or xenon may be used. In one example, the dopant species is germanium at an implant dose greater than about $1E14/cm^2$ or about $5E14/cm^2$ or greater, resulting in a dopant concentration of between about $1E16/cm^3$ to about $1E21/cm^3$. An implant system accelerates ions in an electric field and implants the ion into the substrate. Each individual ion produces on impact many point defects in the substrate crystal structure, such as vacancies and interstitials. Vacancies are crystal lattice points unoccupied by an atom: in this case the ion collides with a target atom, resulting in transfer of a significant amount of energy to the target atom such that it leaves its crystal site. This target atom then itself becomes a projectile in the substrate, and can cause successive collision events. Interstitials result when such atoms (or the original ion itself) come to rest, but find no vacant space in the lattice to reside. These point defects can migrate and cluster with each other, resulting in dislocation loops and other defects. Lastly, the ion can replace an atom in the crystal structure, but because the ion used is not the same material as the substrate, the resulting lattice constant is different from the original. This difference causes strain.

The implantation creates a concentration profile in the substrate to form the trapping features. The substrate may be annealed after the implantation, at a temperature of up to 1000 degrees Celsius. The trapping feature has a footprint larger than the bottom of the trench and is at least 10 nm deep and may be up to a few microns deep. For example, a peak density may be at about 10 nm with a long tail of at least one micron.

In another aspect, the trapping feature may be grown at the bottom of the trench using selective epitaxy. The sidewalls of the trench are first protected by a conformal liner layer. The liner layer is a dielectric material such as a thermally deposited silicon oxide, or atomic layer silicon oxide or silicon nitride. A bottom area of the liner layer is then etched to expose the substrate. A trapping feature is then grown epitaxially from the bottom area. The trapping feature may be germanium, silicon germanium, or graphene (an allotrope of carbon). A trapping feature form in this aspect may be several nanometers thick. After the selective epitaxial process, the substrate may be annealed.

In yet another aspect, the trapping feature may be formed on all surfaces in the trench using chemical vapor deposition processes. In some embodiments, atomic layer deposition (ALD) process forms very thin and conformal layers of material that may be a few atoms thick, at a few angstroms. Repeated ALD processes can form a conformal layer up to several nanometers. ALD can deposit germanium, silicon germanium or carbon. Plasma assisted (PA) or plasma enhanced (PE) CVD may also be used to deposit a conformal layer, though not as thin as ALD. Amorphous carbon can be deposited using PACVD. After the conformal layer is formed, the substrate is annealed at a high temperature, up to about 1000 degrees Celsius.

Referring back to FIG. 1, in operation 109, the trenches are filled with isolation material. The isolation material is usually silicon oxide deposited using high density plasma (HDP) CVD. HDPCVD is used to deposit in trenches having high aspect ratios by concurrent deposition and etching. As material is deposited into the bottom of the trench, plasma etching keeps overhangs at the opening of the trench from closing the opening. Once the trenches are filled, then the power devices are formed in the silicon substrate adjacent to the trenches in operation 111. Depending on the type of power device, the device typically involves multi-step implantation of different materials into the substrate, forming various electrodes and gates over the substrate, and may also include forming additional isolation features. The power devices are generally transistors or diodes. Power transistors include high electron mobility transistors (HEMTs), power MOSFETs, and bipolar junction transistors (BJTs). Power diodes include Schottky diodes and other high voltage diodes.

Figure 2:
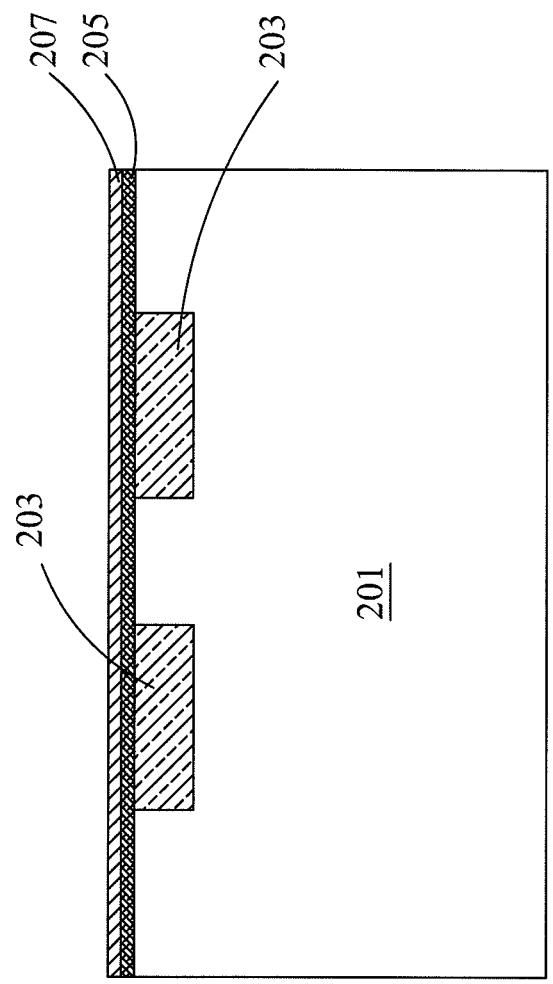
FIGS. 2 to 9C are cross-sectional views of a semiconductor structure at various stages of manufacture according to some embodiments of the method of FIG. 1.

FIGS. 2 to 9C shows cross-sectional views of a semiconductor structure at various stages of manufacture according to some embodiments of the method of FIG. 1. In FIG. 2, silicon substrate 201 has a p-type conductivity. The p-type substrate may be formed by implanting p-type dopants in a bare silicon wafer, or by incorporating p-type dopants during silicon-on-insulator processing. On the p-type substrate shallow trench isolation features 203 are defined, etched, and filled. The wafer is then planarized. A pad oxide layer 205 and a silicon nitride layer 207 are then deposited over the substrate and the STI features 203 using CVD processes to protect the surface of substrate 201 during subsequent processing.

Figure 3:
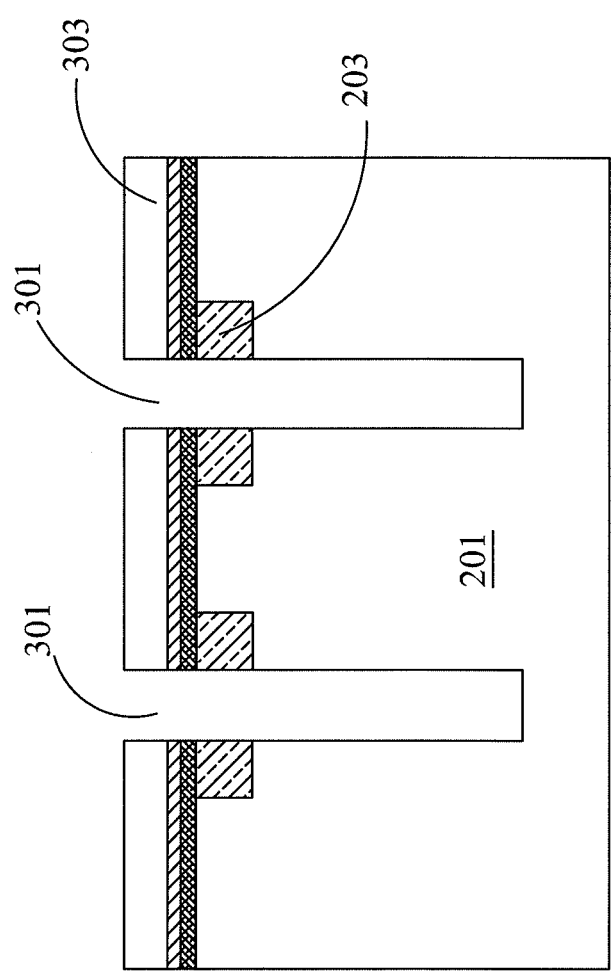

FIG. 3 shows a patterned photoresist layer 303 over the substrate 201. Trenches 301 are etched into the substrate 201. As shown, trenches 301 have high aspect ratios and are used to form deep trench isolation (DTI) features. Note that while the DTI is shown formed through STI features 203, the STI features may not be used. In some embodiments, the STI features 203 may be on one side of the trench only or omitted. In still other embodiments the trapping features are formed adjoining the STI features 203 instead of the DTI.

Figure 4A:
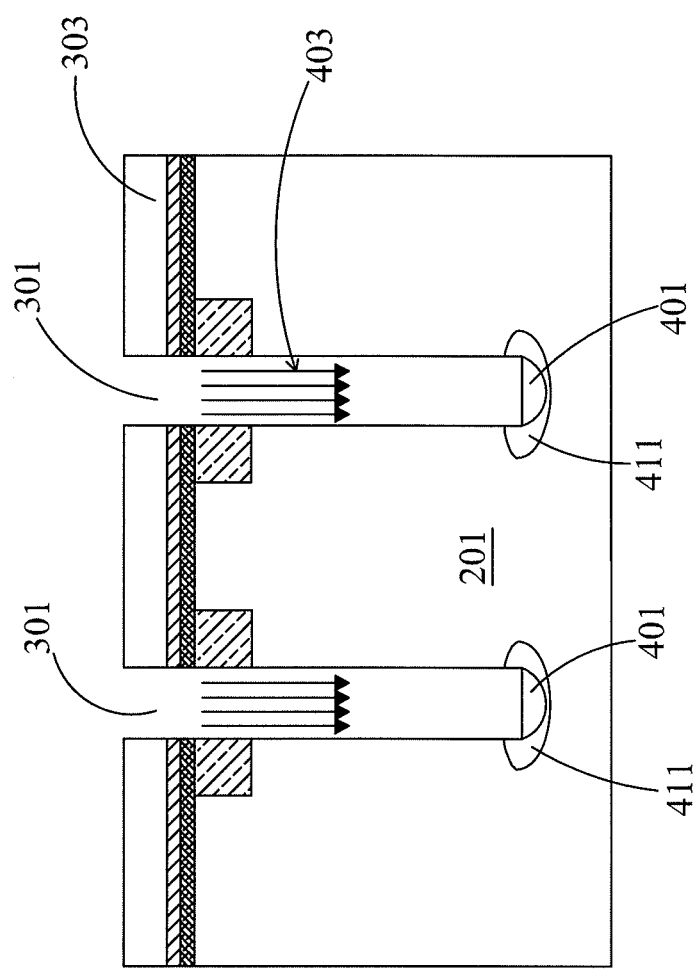
Figure 4B:
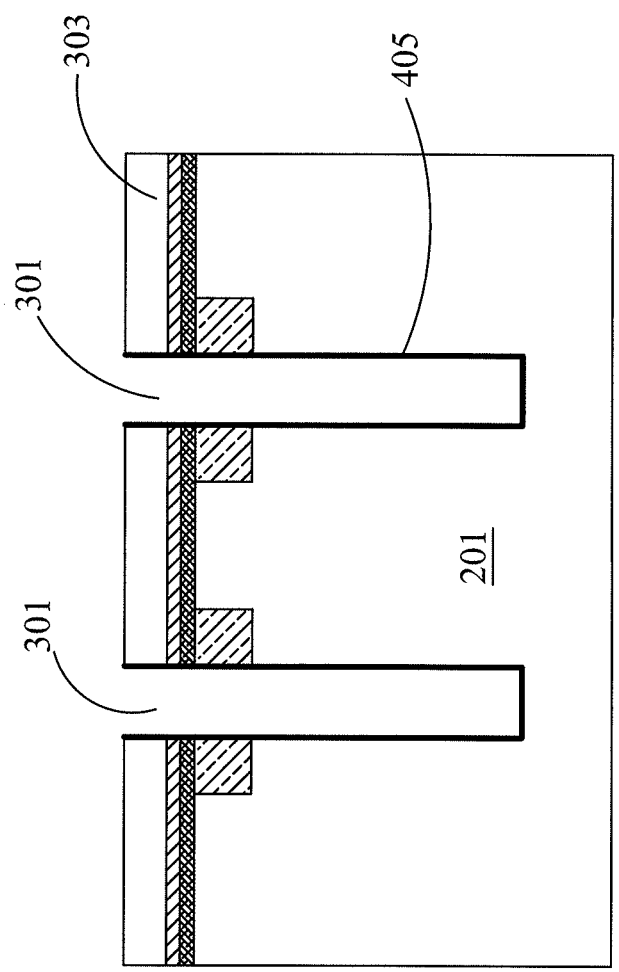
Figure 4C:
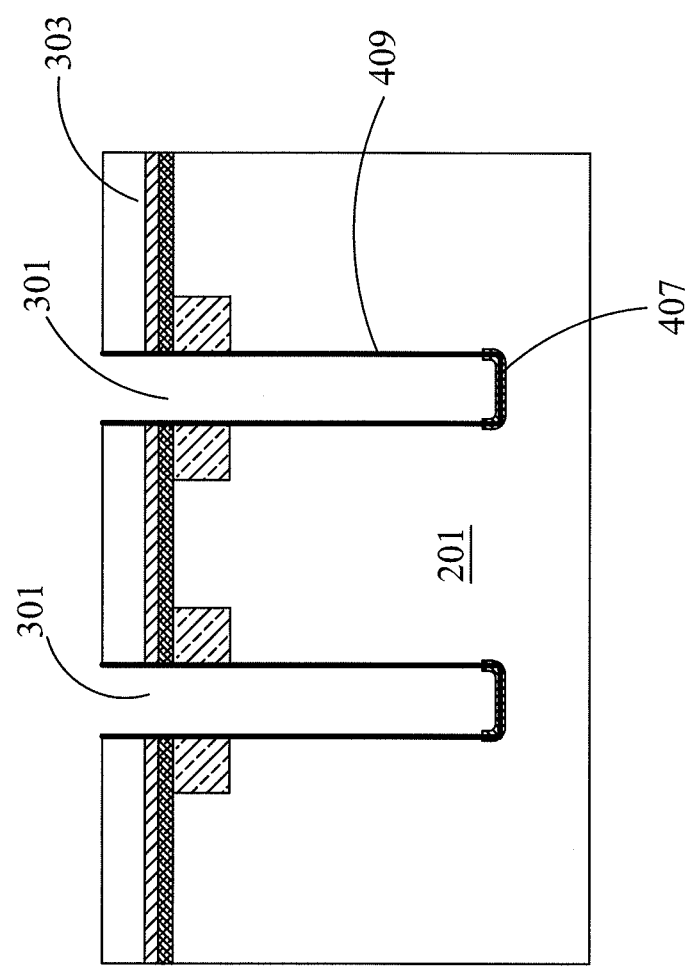

FIGS. 4A, 4B, and 4C shows different types of trapping features are formed using different processes. FIG. 4A shows various embodiments where the trapping features are formed using an implantation process. In FIG. 4A, germanium, carbon, or an inert gas species is implanted into the bottom of the trench 301 as shown by energy arrows 403, with the photoresist layer 303 in place. The implantation creates trapping features 401 in the substrate portion adjoining the bottoms of trenches 301. Depending on the aspect ratio and angles of implantation, some material may be implanted in the sidewalls close to the bottom and along the sidewalls of the trenches 301. According to certain embodiments, the implantation angle is kept at normal, or straight into the bottoms of trenches 301, so that a majority of the implanted species initially placed directly below the trench bottoms in the substrate 201. After the implantation process, the substrate may be annealed and a somewhat larger trapping area 411 may be formed due to implanted species diffusion/migration. While FIG. 4A shows a particular oval shape for the trapping features 401 and 411, the actual trapping features may have different shapes depending on implantation energy, angles of implantation, and whether the substrate is subsequently annealed and at what temperature. For example, a higher implantation energy would penetrate the implanted species deeper into the substrate and result in a different oval shape. Longer or higher temperature anneal processes would increase the migration.

In certain embodiments where only one isolation feature is used between power devices, the trapping features are made larger but without interfering with power device operation. In other embodiments where two isolation features are used between the power devices, the trapping features cannot be so large as to cover a pick-up region between the power devices.

FIG. 4B shows various embodiments where the trapping features 405 are formed by CVD along the sidewalls and the bottoms of the trenches. Trapping features 405 are formed by first depositing a thin layer of germanium, silicon germanium, or carbon in a conformal manner onto the sidewalls and bottom of the trenches 301. The thin layer is then annealed at a higher temperature greater than 500 degrees Celsius, about 700 degrees Celsius, between about 700 degrees Celsius to about 1000 degrees Celsius, or about 1000 degrees Celsius or greater. The anneal increases the thickness of the trapping feature 405 by incorporating the film species into the silicon substrate. Deposited thickness may be on the order of several to over ten and up to 100 nanometers. After annealing, the trapping features 405 may be on the order of several tens of nanometers up to over 200 nanometers.

FIG. 4C shows various embodiments where the trapping feature 407 is epitaxially grown selectively in the bottom of the trenches 301. A conformal liner 409 is first deposited in the trenches 301 along the sidewalls and the bottom. The liner is a dielectric material from which epitaxial film does not grow. The liner is typically silicon oxide and may be other dielectrics such as silicon nitride. A portion of the liner in the bottom is then removed by etching to expose the underlying substrate. Depending on the etching method, more or less of the liner material may be removed.

An epitaxial process is then performed on the exposed substrate to grow a germanium epitaxial film, a silicon germanium epitaxial film, or a graphene film. The process may be metal organic CVD (MOCVD), metal organic vapor phase epitaxy (MOVPE), plasma enhanced CVD (PECVD), remote plasma enhanced CVD (RP-CVD), molecular beam epitaxy (MBE), hydride vapor phase epitaxy (HVPE), chloride vapor-phase epitaxy (Cl-VPE), and/or liquid phase epitaxy (LPE). The film may be annealed to promote diffusion/migration of the germanium or carbon. Note that the various annealing steps described in conjunction with FIGS. 4A to 4C need not occur in the manufacturing processes immediately after the trapping feature formation. Because the substrate may be annealed many times during manufacturing, the anneal steps may be performed later.

Figure 5:
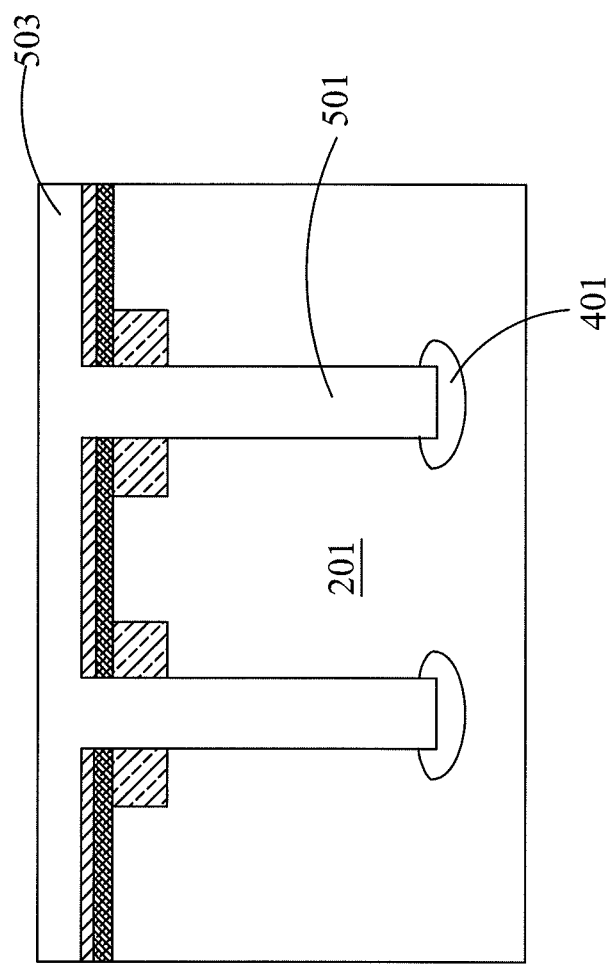

After the initial trapping feature formation, the photoresist layer is removed (stripped) and the trenches 301 are then filled to form isolation features 501 as shown in FIG. 5. The trenches are typically filled with silicon oxide, which is deposited using high density plasma (HDP) CVD. FIG. 5 shows the isolation features 501 and silicon oxide layer 503 in the field above the isolation features 501. To ensure a proper fill without voids, more material is deposited. Removing the photoresist layer before filling the trenches reduces the aspect ratio of the trenches and makes them easier to fill, but removal before filling is not necessary. The photoresist may be removed later.

Figure 6:
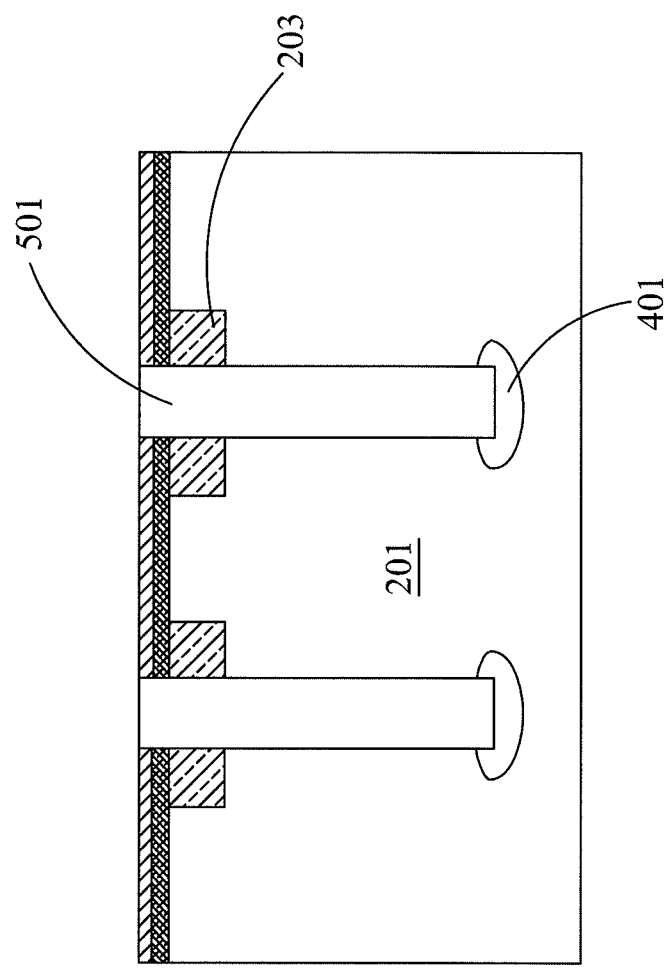
Figure 7:
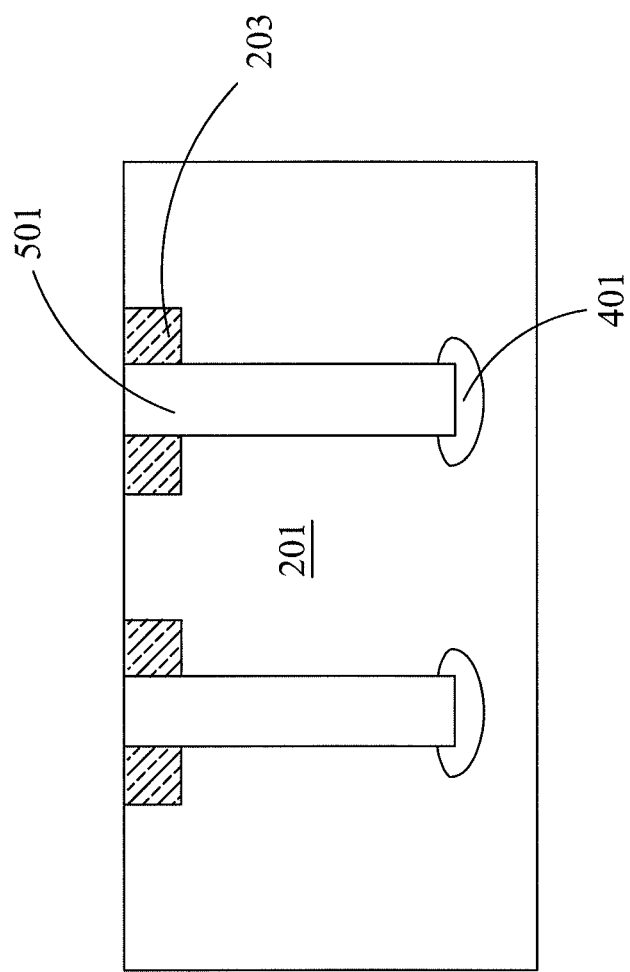

FIG. 6 shows the structure after planarizing the substrate to remove excess silicon oxide layer 503. The planarization is performed using a chemical mechanical polishing process and may include other wet etching operations. The silicon nitride and pad oxide layers are then removed by etching or stripping to expose the substrate between the STI features 203 as shown in FIG. 7. STI features 203 may be doped intentionally or unintentionally in previous or in subsequent steps, leading to the same or to different doping profiles for the various STI features 203. For this reason, each of the STI features 203 is depicted with different shading in the figures below.

Figure 8:
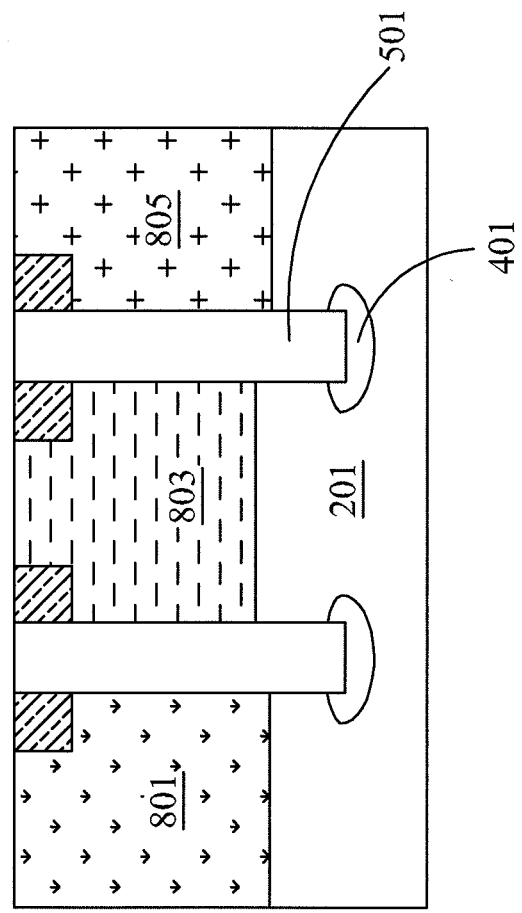

FIG. 8 shows the substrate 201 separated into device regions 801, 803, and 805. In some embodiments, power devices are separated by two isolation features 501. In those embodiments, power devices are formed in regions 801 and 805, but not 803. For example, high voltage n-wells (HVNW) are formed in regions 801 and 805 and a high voltage p-well (HVPW) may be formed in region 803. Power devices are formed over the HVNW in regions 801 and 805, but not over the HVPW in region 803. Region 803 may be used for substrate current pickup. Devices in the various regions 801 and 805 need not be the same type of power devices. The size of region 803 corresponds to the latchup rule minimum distance between the isolation features 501. Use of the trapping features 401 enables a smaller latchup rule so that the size of region 803, which does not include any device, can be reduced. Reduction of regions 803 allows more power devices to be placed in the same sized area.

In other embodiments, power devices are formed in each of regions 801, 803, and 805. Devices in the various regions 801, 803 and 805 need not be the same type of power devices. The isolation features 501 with trapping features 401 are placed between adjacent power devices. In these embodiments, the trapping features 401 sufficiently reduce carrier lifetime and therefore substrate current so that pickup regions are not used between some adjacent regions. However, some pickup regions may still be used in a cluster of power devices. For example, a pickup region may be surrounded by 4 or more power devices.

In one embodiment, a pickup region having isolation features and trapping features may be surrounded by 4 or more power devices. While each power device is separated from an adjacent power device by at least one isolation feature and trapping feature, only one of the separating isolation features adjoins a pickup region. In other words, each power device region is has one pickup region neighbor and rest of its adjacent regions are other power devices.

Figure 9A:
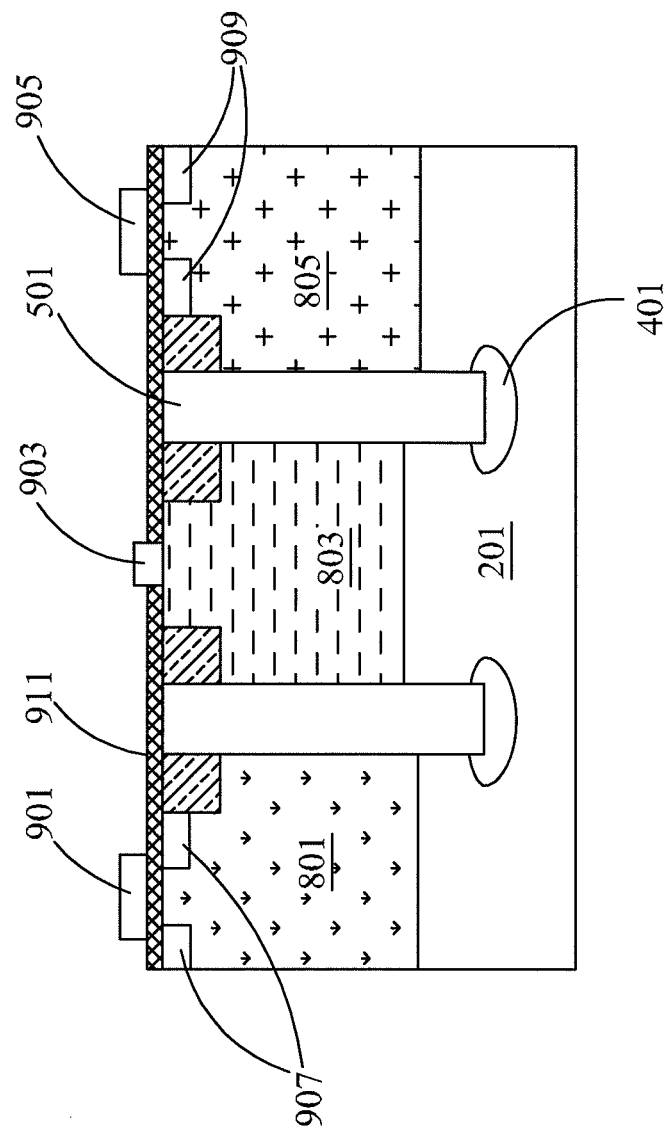
Figure 9B:
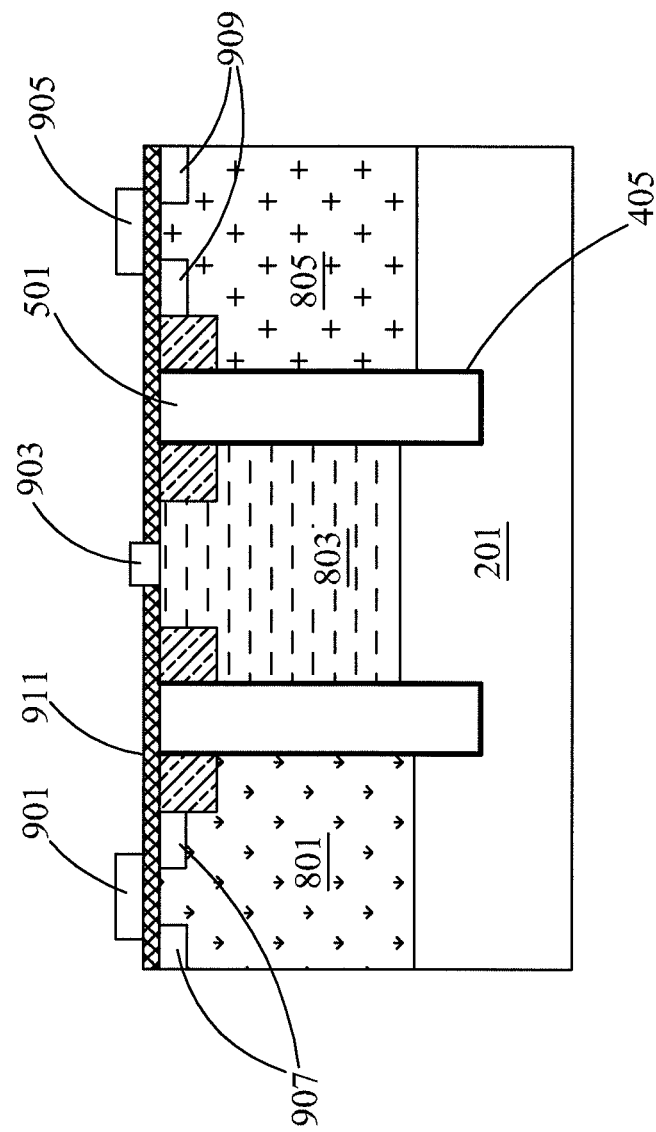
Figure 9C:
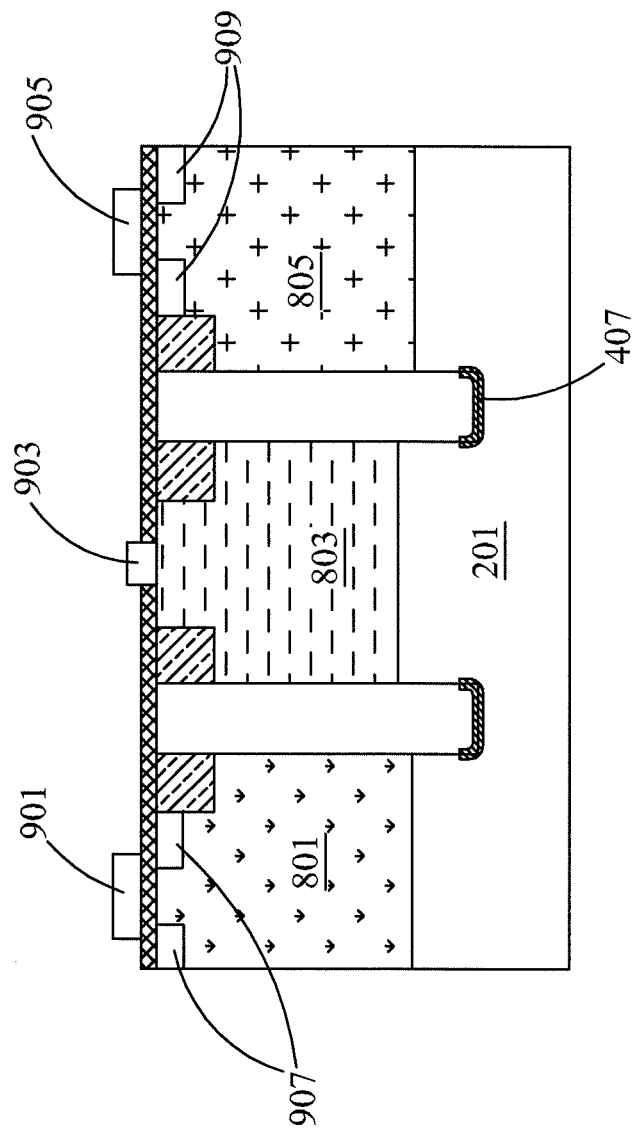

FIGS. 9A, 9B, and 9C show example structures of various embodiments in accordance with the present disclosure. FIG. 9A shows the implanted trapping feature embodiment, with trapping features 401 formed below a bottom of the isolation features 501. Regions 801 and 803 are power devices, with gates 901 and 905 and doped regions 907 and 909. Pickup electrode 903 connects to the substrate in region 803 through dielectric layer 911. Note that in this example, the power device regions are shallower than the trapping features 401. Deeper trapping features 401 reduces the likelihood that the trapping features 401 interfere with power device operation.

FIG. 9B shows the conformal trapping feature embodiment, with trapping features 405 formed on sidewalls and bottom of the isolation features 501. Regions 801 and 803 are power devices, with gates 901 and 905 and doped regions 907 and 909. Pickup electrode 903 connects to the substrate in region 803 through dielectric layer 911.

FIG. 9C shows the epitaxial trapping feature embodiment, with trapping features 407 grown on bottoms of the isolation features 501. Regions 801 and 803 are power devices, with gates 901 and 905 and doped regions 907 and 909. Pickup electrode 903 connects to the substrate in region 803 through dielectric layer 911.

A semiconductor structure according to FIG. 9A was simulated to determine the change in current lifetimes using different implant dosages of germanium. In the simulation, regions 801 and 805 are high voltage n-wells (HVNWs), and region 803 is a high voltage p-well (HVPW). Regions 907 over region 801 are p-doped; and regions 909 over region 805 are also p-doped. Polysilicon gate structures over regions 801 and 805 are formed. A pickup structure is formed over region 803. A BJT was simulated with the region 801 as the emitter, 803 as the base, and 805 as the collector. The simulation provided 4 scenarios of different germanium implantation: $1E14/cm^2$, $5E14/cm^2$, $1E15/cm^2$, and none.

Figure 10:
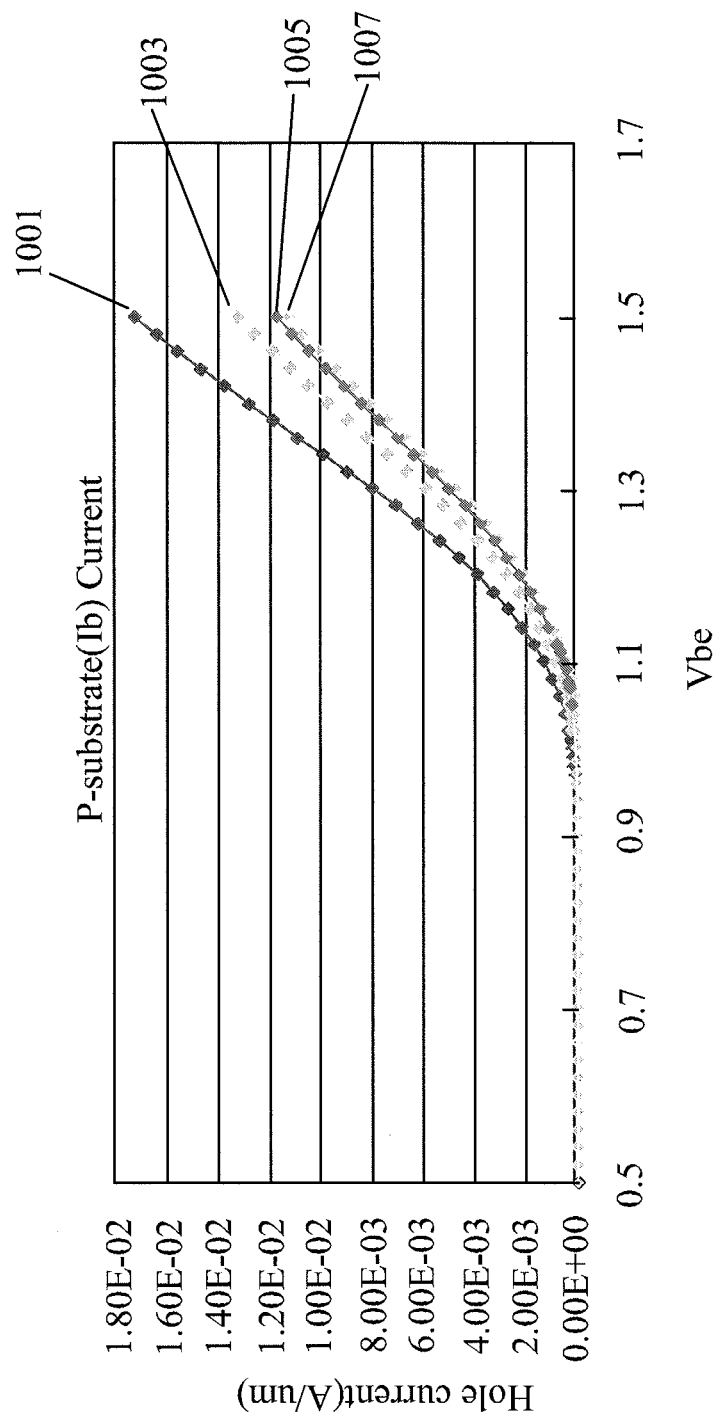
FIGS. 10 and 11 are plots of electrical properties of a semiconductor structure that simulates a bipolar junction transistor (BJT) in accordance with one embodiment of this disclosure.

FIG. 10 shows the hole current for each of the scenarios under different base to emitter voltages (Vbe). The hole current between base and emitter, i.e, between Regions 803 and 801, simulates leakage substrate current. Line 1001 corresponds to the scenario with no germanium implanted. Line 1003 corresponds to the scenario with an implant concentration of $1E14/cm^2$. Line 1005 corresponds to the scenario with an implant concentration of $5E14/cm^2$. Line 1007 corresponds to the scenario with an implant concentration of $1E15/cm^2$. FIG. 10 shows that hole currents are significantly reduced between Lines 1001 and 1003, and somewhat reduced between Lines 1003 and 1005, and slightly reduced between Lines 1005 and 1007. At every Vbe, the hole current between the base and emitter is reduced with additional implant dosage.

Figure 11:
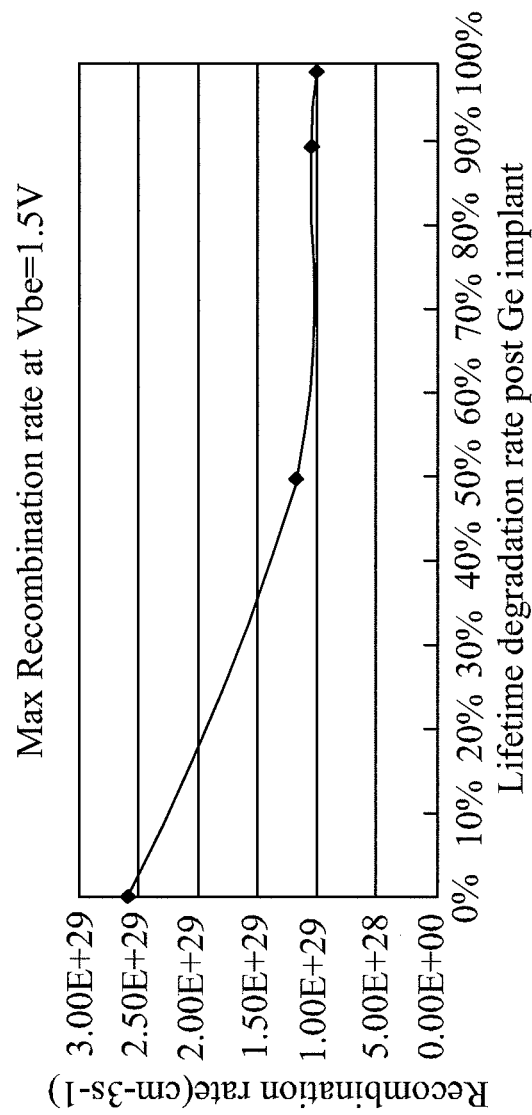

FIG. 11 shows the relationship between different implant doses. FIG. 11 shows the recombination rate (recombination/$cm^3$s) over lifetime degradation rate. Each of the data points of FIG. 11 correspond to one scenario shown as a Line in FIG. 10. In other words, Line 1001 corresponds to the 0% lifetime degradation data point in FIG. 11 because there is no change in carrier lifetimes. Line 1003 corresponds to the approximate 50% lifetime degradation data point in FIG. 11 because there is about 50% carrier lifetime reduction. FIG. 11 shows that the recombination rate reduced significantly with having a trapping feature at any implant dose. However, the recombination rate was not significantly further reduced with additional implant dosage. The simulated data shows that a nominal dose of $1E14/cm^2$ is effective in reducing substrate current and decreasing the recombination rate, but $5E14/cm^2$ is better. Small and perhaps insignificant additional benefit is gained from additional dosage at $1E15/cm^2$. Overall the simulation proves that the trapping features are effective at reducing substrate current. The substrate current reduction reduces the likelihood of a latchup circuit.

Although the embodiments and its advantages have been described in detail, it should be understood that various changes, substitutions and alterations can be made herein without departing from the spirit and scope of the disclosure as defined by the appended claims. Although the various embodiments have been described in terms of high voltage power devices, the trapping features may also be used for isolating devices that are not power devices. Devices operating at lower voltages have less substrate current and therefore are less likely to form a latchup circuit. However, as critical dimensions continues to shrink, better isolation features decrease likelihood of interference between devices and at small enough critical dimensions, isolation features with trapping features can improve circuit performance.

While the simulation shows implant dosage for one embodiment, one skilled in the art would be able to find optimal concentrations and process parameters for different embodiments of the present disclosure. For example, the epitaxial trapping feature having different thicknesses and different silicon to germanium concentrations can be simulated or tested.

Moreover, the scope of the present application is not intended to be limited to the particular embodiments of the process, machine, manufacture, and composition of matter, means, methods and steps described in the specification. As one of ordinary skill in the art will readily appreciate from the disclosure of the present invention, processes, machines, manufacture, compositions of matter, means, methods, or steps, presently existing or later to be developed, that perform substantially the same function or achieve substantially the same result as the corresponding embodiments described herein may be utilized according to the present invention. Accordingly, the appended claims are intended to include within their scope such processes, machines, manufacture, compositions of matter, means, methods, or steps.

What is claimed:

1. A semiconductor structure comprising:
   a substrate;
   a first power device in a first well region and a second power device in a second well region of the substrate;
   a pickup region between the first well region and the second well region;
   at least one isolation feature between the first well region and the second well region, wherein the at least one isolation feature has a bottom and a plurality of sidewalls;
   at least one shallow trench isolation (STI) feature in direct contact with a sidewall of the plurality of sidewalls;
   a trapping feature adjoining the bottom and an entirety of the plurality of sidewalls, wherein the trapping feature separates an entirety of the isolation feature from the pickup region and the first well region or from the pickup region and the second well region; and
   a pickup electrode in direct contact with the pickup region.

2. The semiconductor structure of claim 1, wherein the trapping feature comprises carbon or germanium.

3. The semiconductor structure of claim 1, wherein the at least one isolation feature is two deep trench isolation (DTI) features.

4. The semiconductor structure of claim 1, wherein the trapping feature is disposed between a portion of the substrate and the at least one isolation feature.

5. The semiconductor structure of claim 1, wherein a portion of the trapping feature is disposed between the first power device and the at least one isolation feature.

6. The semiconductor structure of claim 1, wherein a portion of the trapping feature is disposed between the second power device and the at least one isolation feature.

7. The semiconductor structure of claim 1, wherein the first power device and the second power device are different power devices.

8. A semiconductor structure comprising:
   a substrate;
   a first and second power device having high-voltage well (HVW) regions of a first conductivity type overlying the substrate;
   a pickup region of a second conductivity type between the first and second power device wherein the first conductivity type is different from the second conductivity type;
   a first shallow trench isolation (STI) between the first power device and the pickup region;

a first isolation feature between the first power device and the pickup region and extending below a bottom of the first power device and a bottom of the pickup region;
a first trapping feature adjoining the first isolation feature and in direct contact with a sidewall of the first STI;
a second STI between the second power device and the pickup region;
a second isolation feature between the second power device and the pickup region and extending below a bottom of the second power device and the bottom of the pickup region; and
a second trapping feature adjoining the second isolation feature and in direct contact with a sidewall of the second STI, wherein
the first trapping feature and the second trapping feature are a semiconductor material,
the first trapping feature separates the first isolation feature from the pickup region, the first power device, and the substrate, and
the second trapping feature separates the second isolation feature from the pickup region, the second power device, and the substrate.

9. The semiconductor structure of claim 8, wherein at least one of the first trapping feature or the second trapping feature comprises silicon germanium.

10. The semiconductor structure of claim 8, wherein at least one of the first trapping feature or the second trapping feature has a thickness of less than two microns.

11. The semiconductor structure of claim 8, wherein at least one of the first trapping feature or the second trapping feature has a thickness of less than 200 nanometers.

12. A semiconductor structure comprising:
a substrate;
a first power device formed in a first power device region of the substrate;
a second power device formed in a second power device region of the substrate;
a pickup region between the first power device and the second power device;
a pickup electrode in direct contact with the pickup region; and
at least one isolating element disposed in the substrate between the first power device region and the second power device region, wherein each of the at least one isolating element comprises:
an isolation feature adjoining the pickup region, the substrate below the pickup region, and adjoining one of the first power device region and the second power device region, the isolation feature having a conformal portion of a first dielectric material on sidewalls of the isolation feature and having a filled portion of a second dielectric material against the conformal portion and isolated from the first power device region, the second power device region, and the substrate; and
a trapping feature adjoined to the isolation feature, wherein the trapping feature is along a first portion of sidewalls of the isolation feature, adjoins a bottom of the conformal portion and a bottom of the filled portion of the isolation feature and exposes a second portion of sidewalls of the isolation feature, and the trapping feature comprises germanium.

13. The semiconductor structure of claim 12, wherein at least one of the first power device region or the second power device region comprises a well, and a depth of the at least one isolating element from a top surface of the substrate is greater than a depth of the well.

14. The semiconductor structure of claim 12, wherein the isolation feature comprises a deep trench isolation (DTI) feature disposed in the substrate.

15. The semiconductor structure of claim 12, wherein the isolation feature comprises:
a deep trench isolation (DTI) feature disposed in the substrate; and
a shallow trench isolation (STI) feature disposed in the substrate adjacent to the DTI feature, wherein a depth of the DTI from a top surface of the substrate is greater than a depth of the STI feature.

16. The semiconductor structure of claim 12, wherein the isolation feature comprises:
a deep trench isolation (DTI) feature;
a first shallow trench isolation (STI) feature disposed in the substrate on a first side of the DTI feature; and
a second shallow trench isolation (STI) feature disposed in the substrate on a second side of the DTI feature opposite the first side of the DTI feature, wherein a depth of the DTI from a top surface of the substrate is greater than a depth of the first STI feature and the depth of the DTI feature from the top surface of the substrate is greater than a depth of the second STI feature.

17. The semiconductor structure of claim 12, wherein the trapping feature is disposed to separate the isolation feature from the substrate.

18. The semiconductor structure of claim 12, wherein the trapping feature is conformal with a bottom portion of the isolation feature farthest from a top surface of the substrate.

19. The semiconductor structure of claim 12, wherein the trapping feature comprises silicon-germanium.

20. The semiconductor structure of claim 12, wherein the trapping feature further comprises carbon.

* * * * *